US012327601B2

(12) United States Patent
Luo et al.

(10) Patent No.: US 12,327,601 B2
(45) Date of Patent: *Jun. 10, 2025

(54) METHOD AND APPARATUS FOR POWER SAVING IN SEMICONDUCTOR DEVICES

(71) Applicant: Yangtze Memory Technologies Co., Ltd., Hubei (CN)

(72) Inventors: Jian Luo, Wuhan (CN); Zhuqin Duan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/610,880

(22) Filed: Mar. 20, 2024

(65) Prior Publication Data
US 2024/0233781 A1 Jul. 11, 2024

Related U.S. Application Data

(63) Continuation of application No. 17/472,542, filed on Sep. 10, 2021, now Pat. No. 11,967,393, which is a
(Continued)

(51) Int. Cl.
*G11C 5/14* (2006.01)
*G06F 1/06* (2006.01)
*G11C 11/40* (2006.01)

(52) U.S. Cl.
CPC ............... *G11C 5/148* (2013.01); *G06F 1/06* (2013.01); *G11C 11/40* (2013.01)

(58) Field of Classification Search
CPC ..... G11C 5/148; G11C 11/40; G11C 16/0483; G11C 7/222; G11C 16/20; G11C 16/32;
(Continued)

(56) References Cited

U.S. PATENT DOCUMENTS 5,247,640 A 9/1993 Maehara
6,457,167 B1 9/2002 Kitahara
(Continued)

FOREIGN PATENT DOCUMENTS

CN 101930798 A 12/2010
CN 102193580 A 9/2011
(Continued)

OTHER PUBLICATIONS

International Search Report issued Mar. 1, 2022 in PCT/CN2021/095709, 4 pages.

(Continued)

*Primary Examiner* — Michael T Tran
(74) *Attorney, Agent, or Firm* — Oblon, McClelland, Maier & Neustadt, L.L.P.

(57) ABSTRACT

A semiconductor device includes a clock gating circuit and a control circuit. The clock gating circuit outputs a gated clock signal based on a clock signal. Transitions of the clock signal are output in the gated clock signal in response to a clock enable signal having an enable value and are disabled from being output in the gated clock signal in response to the clock enable signal having a disable value. The control circuit includes a first portion that operates based on the clock signal. The first portion sets the clock enable signal to the disable value in response to a disable control and sets the clock enable signal to the enable value in response to a wakeup control. The control circuit includes a second portion that operates based on the gated clock signal. The second portion provides the disable control to the first portion during an operation.

20 Claims, 8 Drawing Sheets

Related U.S. Application Data continuation of application No. PCT/CN2021/095709, filed on May 25, 2021.

(58) Field of Classification Search
CPC ......... G11C 16/06; G06F 1/06; G06F 1/3243; G06F 1/3275; G06F 1/3237; Y02D 10/00
USPC ............................................ 365/226, 230.06
See application file for complete search history.

(56) References Cited

U.S. PATENT DOCUMENTS

| | | |
|---|---|---|
| 7,958,483 B1 | 6/2011 | Alben |
| 7,982,498 B1 | 7/2011 | Chen |
| 8,929,162 B1 | 1/2015 | Fender |
| 9,250,679 B2 | 2/2016 | Park |
| 9,612,611 B1 | 4/2017 | Nakibly |
| 9,990,987 B2 | 6/2018 | Kumar |
| 10,176,858 B1 | 1/2019 | Wilmoth |
| 2006/0109087 A1 | 5/2006 | Kim |
| 2007/0210833 A1* | 9/2007 | Hamdan .................. G06F 1/10 326/93 |
| 2008/0080297 A1 | 4/2008 | Stames |
| 2009/0158076 A1 | 6/2009 | Chejara |
| 2009/0304134 A1* | 12/2009 | Akers ..................... G06F 1/12 375/354 |
| 2011/0158032 A1 | 6/2011 | Kang |
| 2012/0249559 A1 | 10/2012 | Khodorkovsky |
| 2012/0278664 A1* | 11/2012 | Kazui ................. G06F 11/1012 714/48 |
| 2014/0215241 A1 | 7/2014 | Yoon |
| 2016/0036395 A1 | 12/2016 | Stevens |
| 2016/0363955 A1* | 12/2016 | Stevens .................... G06F 1/12 |
| 2018/0088659 A1 | 3/2018 | Phan |
| 2018/0268088 A1* | 9/2018 | Oruganti ............ H03K 19/0016 |
| 2018/0364781 A1 | 12/2018 | Schreiber |
| 2019/0087361 A1 | 3/2019 | Hisamatsu |
| 2019/0227749 A1* | 7/2019 | Wakchaure .......... G06F 3/0604 |
| 2019/0288532 A1 | 9/2019 | Mattos |
| 2019/0391747 A1* | 12/2019 | Sheperek .............. G06F 3/0679 |
| 2020/0177168 A1 | 6/2020 | Aremallapur |
| 2020/0228123 A1 | 7/2020 | Oh |
| 2020/0393868 A1 | 12/2020 | Oh |
| 2021/0027854 A1 | 1/2021 | Lin |
| 2022/0383911 A1 | 12/2022 | Luo |

FOREIGN PATENT DOCUMENTS

| | | |
|---|---|---|
| CN | 101403944 B | 4/2012 |
| CN | 104516296 A | 4/2015 |
| CN | 111192606 A | 5/2020 |
| CN | 111224877 A | 6/2020 |
| CN | 112130617 A | 12/2020 |
| CN | 112639795 A | 4/2021 |
| CN | 112751560 A | 5/2021 |
| CN | 113141385 A | 7/2021 |
| CN | 111125493 B | 11/2021 |
| CN | 114490009 A | 5/2022 |
| DE | 69933515 T2 | 6/2007 |
| EP | 2166426 A2 | 3/2010 |
| EP | 4099130 A1 | 12/2022 |
| GB | 2493416 A | 2/2013 |
| WO | WO 2015/014162 A1 | 2/2015 |
| WO | 2017021188 A1 | 2/2017 |
| WO | 2018007839 A1 | 1/2018 |

OTHER PUBLICATIONS

Combined Office Action and Search Report issued on Apr. 27, 2023 in the corresponding Chinese Patent Application No. 202180001831.9 (with Translation of Category of Cited Documents), 9 pages.

Chinese Office Action and Search Report issued on Aug. 19, 2023 in the corresponding Chinese Application No. 202180001831.9 (with Translation of Category of Cited Documents), 8 pages.

Mohammad Waqar Bhat, Design and implementation of power efficient clock gated dual-port SRAM, 2022, Journal of Physics: Conference Series 2325.1. IOP Publishing, all pages (Year: 2022).

* cited by examiner

| | WAKEUP CONDITIONS | | |
|---|---|---|---|
| READ | READ WAKEUP SOURCE 0 | READ WAKEUP SOURCE 1 | READ WAKEUP SOURCE 2 |
| PROGRAM (PGM) | PGM WAKEUP SOURCE 0 | PGM WAKEUP SOURCE 1 | PGM WAKEUP SOURCE 2 |
| ERASE | ERASE WAKEUP SOURCE 0 | ERASE WAKEUP SOURCE 1 | ERASE WAKEUP SOURCE 2 |

FIG. 4

METHOD AND APPARATUS FOR POWER SAVING IN SEMICONDUCTOR DEVICES

RELATED APPLICATION

This application is a continuation of U.S. application Ser. No. 17/472,542 filed on Sep. 10, 2021, now U.S. Pat. No. 11,967,393 issued on Apr. 23, 2024, which is a bypass continuation of International Application No. PCT/CN2021/095709, filed on May 25, 2021. The entire disclosure of the prior application is hereby incorporated by reference in its entirety.

TECHNICAL FIELD

The present application describes examples generally related to semiconductor devices.

BACKGROUND

Semiconductor devices, such as semiconductor memory devices, semiconductor computing devices, and the like, may have significant power consumption. For numerous reasons, it is typically desirable to reduce the power consumption of the semiconductor devices.

In the field of memory devices, semiconductor memory devices can be categorized into volatile memory devices and non-volatile memory devices. The volatile memory devices can lose data when power is off. The non-volatile memory devices can retain stored data even when power is disconnected. To achieve higher data storage density, semiconductor manufacturers developed vertical device technologies, such as three dimensional (3D) NAND flash memory technology, and the like. 3D NAND flash memory device is a kind of non-volatile memory device.

SUMMARY

Aspects of the disclosure provide a semiconductor device that includes a clock gating circuit and a control circuit. The clock gating circuit outputs a gated clock signal based on a clock signal. Transitions of the clock signal are output in the gated clock signal in response to a clock enable signal having an enable value and are disabled from being output in the gated clock signal in response to the clock enable signal having a disable value. The control circuit includes a first portion that operates based on the clock signal. The first portion sets the clock enable signal to the disable value in response to a disable control and sets the clock enable signal to the enable value in response to a wakeup control. The control circuit includes a second portion that operates based on the gated clock signal. The second portion provides the disable control to the first portion during an operation.

Aspects of the disclosure also provide a semiconductor memory device. The semiconductor memory device includes a memory cell array having a block of memory cells and peripheral circuitry coupled with the memory cell array. The peripheral circuitry includes a microcontroller unit (MCU). The MCU includes a clock gating circuit, a polling module and a processing core. The clock gating circuit outputs a gated clock signal based on a clock signal. Transitions of the clock signal are output in the gated clock signal in response to a clock enable signal having an enable value and are disabled from being output in the gated clock signal in response to the clock enable signal having a disable value. The polling module operates based on the clock signal and sets the clock enable signal to the disable value in response to a disable control and sets the clock enable signal to the enable value in response to a wakeup control. The processing core operates based on the gated clock signal. The processing core provides the disable control to the polling module during an operation.

Aspects of the disclosure also provide a method for power saving in a microcontroller unit (MCU). The method includes receiving, by a first portion of the MCU, a disable control from a second portion of the MCU, and disabling, by the first portion of the MCU, signal transitions in a gated clock signal that is provided to the second portion of the MCU in response to the disable control. Further, the method includes enabling, by the first portion of the MCU, the signal transitions in the gated clock signal in response to a wakeup control.

BRIEF DESCRIPTION OF THE DRAWINGS

Aspects of the present disclosure can be best understood from the following detailed description when read with the accompanying figures. It is noted that, in accordance with the standard practice in the industry, various features are not drawn to scale. In fact, the dimensions of the various features may be increased or reduced for clarity of discussion.

FIG. 4 shows a table of wakeup source priorities according to some examples of the disclosure.

DETAILED DESCRIPTION

Figure 1:
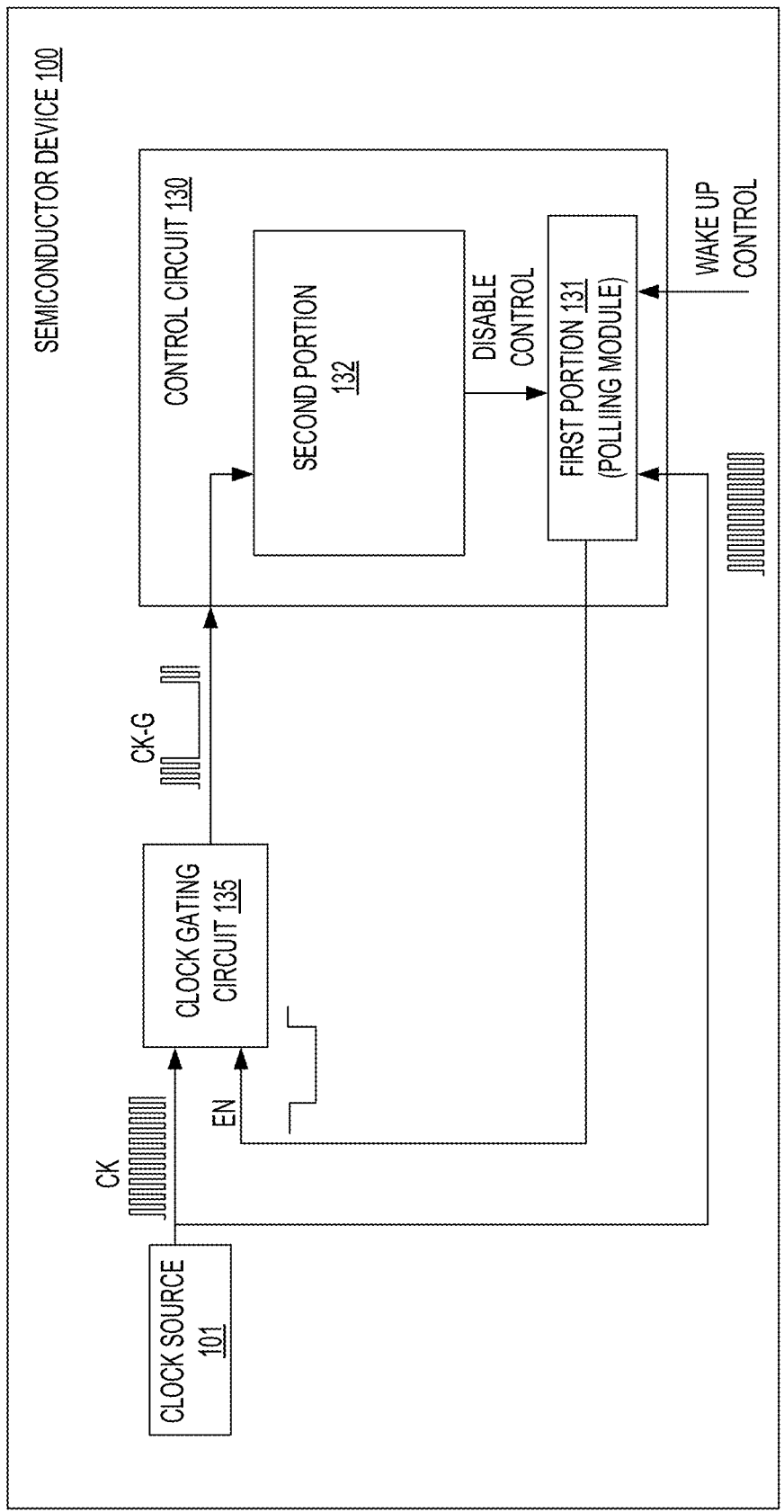
FIG. 1 shows a block diagram of a semiconductor device according to some examples of the disclosure.

The following disclosure provides many different examples, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include examples in which the first and second features are formed in direct contact, and may also include examples in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various examples and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a semiconductor device with a polling module in a control circuit for power saving. The control circuit can operate based on a clock signal and a gated clock signal. The gated clock signal is provided by a clock gating circuit based on the clock signal. Transitions of the clock signal are output in the gated clock signal in response to a clock enable signal having an enable value and transitions in the clock signal are disabled from being output in the gated clock signal in response to the clock enable signal having a disable value. The control circuit includes a first portion that is referred to as the polling module, and the polling module operates based on the clock signal. The control circuit also includes a second portion that operates based on the gated clock signal. In some examples, the second portion can have a much larger number of transistors than the first portion. In an example, the second portion is implemented using sequential circuitry that operates in response to transitions in the gated clock signal. The polling module sets the clock enable signal to the disable value in response to a disable control from the second portion and sets the clock enable signal to the enable value in response to a wakeup control that comes from for example, an external source of the control circuit. The second portion of the control circuit operates based on the gated clock signal. Thus, when the clock enable signal has the disable value, the gated clock signal has no signal transition (e.g., having a constant low voltage corresponding to "0", having a constant high voltage corresponding to "1" and the like), transistors in the second portion of the control circuits do not switch, dynamic power consumption is reduced and power saving can be achieved.

FIG. 1 shows a block diagram of a semiconductor device 100 according to some examples of the disclosure. The semiconductor device 100 includes a control circuit 130 with a polling module for power saving. In the FIG. 1 example, the control circuit 130 includes a first portion 131 that operates based on a regular clock signal CK, and a second portion 132 that operates based on a gated clock signal CK-G. The first portion 131 is also referred to as the polling module (PM) 131.

The regular clock signal CK can be provided by a clock source 101. In an example, the regular clock signal CK continuously oscillates between a high voltage and a low voltage when the semiconductor device 100 is powered up. In an example, the clock source 101 includes a clock generation circuit that generates the regular clock signal CK when the semiconductor device 100 is powered up. In another example, the clock source 101 receives a system clock (not shown) from an external source of the semiconductor device 100, and provides the regular clock signal CK based on the system clock.

In some examples, the semiconductor device 100 includes a clock gating circuit 135 that is configured to generate the gated clock signal CK-G based on the regular clock signal CK and a clock enable signal EN. Transitions (e.g., voltage transitions between the high voltage and the low voltage) in the regular clock signal CK are enabled/disabled for outputting in the gated clock signal CK-G based on the clock enable signal EN. For example, when the clock enable signal EN has a first value (also referred to as enable value), such as "1" (e.g., high voltage level) in the FIG. 1 example, the clock gating circuit 135 outputs transitions (voltage transitions) in the gated clock signal CK-G in response to the transitions in the regular clock signal CK; when the clock enable signal EN has a second value (also referred to as disable value), such as "0" (e.g., ground voltage level) in FIG. 1 example, the clock gating circuit 135 outputs a constant voltage level, such as ground voltage level, as the gated clock signal CK-G regardless of the transitions in the regular clock signal CK.

According to an aspect of the disclosure, the clock enable signal EN is provided by the polling module 131. The polling module 131 operates based on the regular clock signal CK, and can include any suitable combinational circuit and sequential circuit (e.g., latches, flip-flops and the like). In some examples, the polling module 131 receives control signals from the second portion 132 and/or external sources of the control circuit 130. For example, the polling module 131 receives a disable control from the second portion 132 and a wakeup control from one or more external sources of the control circuit 130. The disable control can cause the polling module 131 to set the clock enable signal EN to the disable value, and the wakeup control can cause the polling module 131 to set the clock enable signal EN to the enable value.

In some examples, the second portion 132 includes a large number of transistors in sequential circuitry that operate in response to transitions in the gated clock signal CK-G. When the gated clock signal CK-G has a constant voltage level (transitions are gated), the transistors in the sequential circuitry do not switch.

During operation, in an example, initially the polling module 131 outputs the clock enable signal EN with the enable value. When the clock enable signal EN has the enable value, the clock gating circuit 135 outputs transitions in the gated clock signal CK-G in response to the transitions in the regular clock signal CK. The gated clock signal CK-G is provided to the second portion 132, and transistors in the second portion 132 may switch in response to the gated clock signal CK-G.

In response to certain conditions (e.g., idle mode, sleep mode), the second portion 132 provides the disable control to cause the polling module 131 to output the clock enable signal EN with the disable value. When the clock enable signal EN has the disable value, the clock gating circuit 135 outputs the gated clock signal CK-G with a constant voltage level. Then, the transistors in the second portion 132 do not switch, and thus dynamic power consumption can be reduced, and power saving can be achieved.

It is noted that the polling module 131 operates based on the regular clock signal CK, and can continue operations when the second portion 132 halts operations. When the external source provides the wakeup control, the polling module 131 can output the clock enable signal EN with the enable value, and then the clock gating circuit 135 outputs transitions in the gated clock signal CK-G in response to the transitions in the regular clock signal CK. Then, the sequential circuitry in the second portion 132 can continue operations.

It is noted that semiconductor device 100 can be any suitable device. In some examples, the semiconductor device 100 is a semiconductor memory device that is described in detail with reference to FIG. 2 and FIG. 3.

Figure 2:
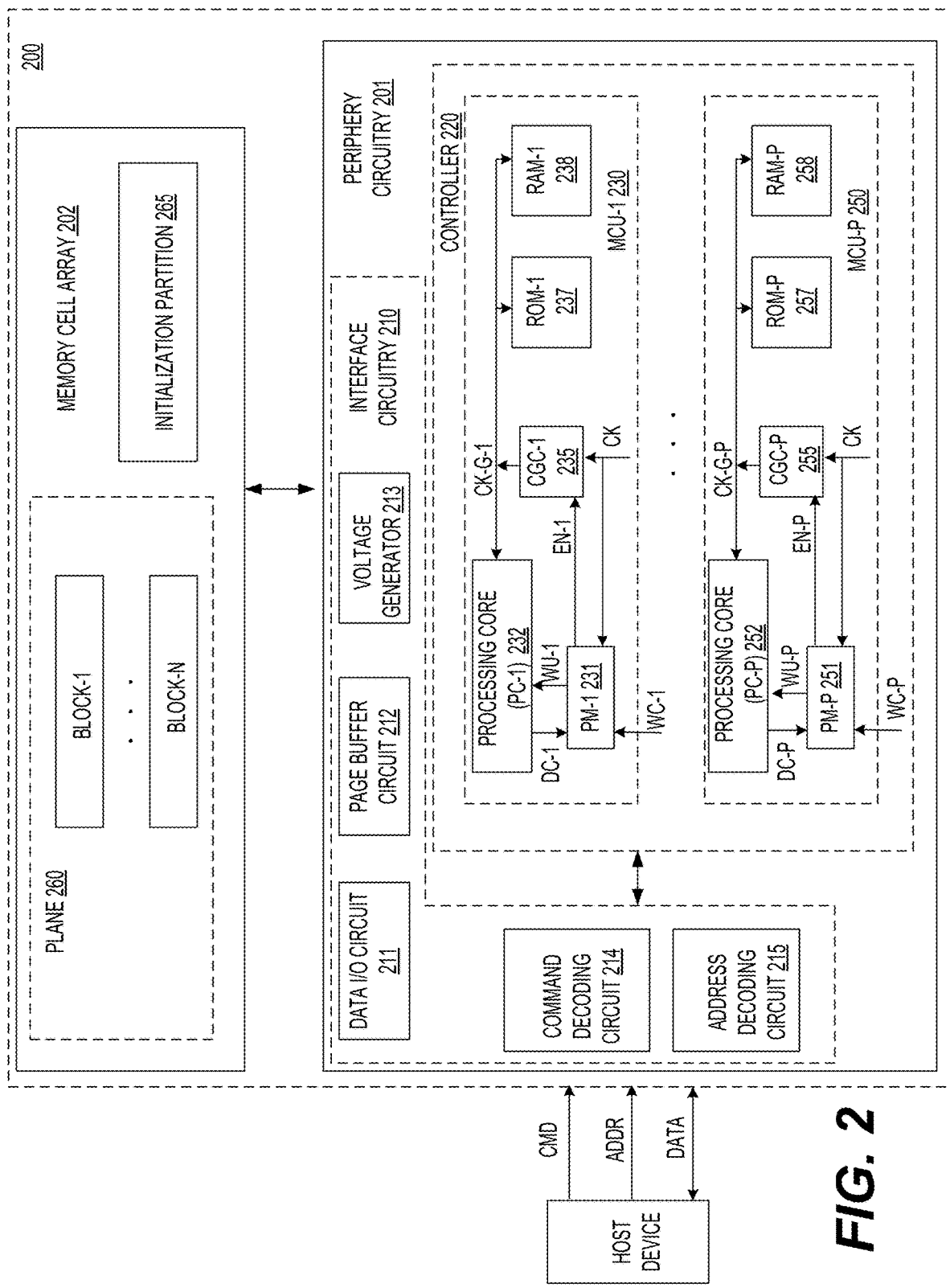
FIG. 2 shows a block diagram of a semiconductor memory device according to some examples of the disclosure.

FIG. 2 shows a block diagram of a semiconductor memory device 200 according to some examples of the disclosure. The semiconductor memory device 200 includes a memory cell array 202 and peripheral circuitry 201 coupled together. In some examples, the memory cell array 202 and the peripheral circuitry 201 are disposed on a same die (chip). In other examples, the memory cell array 202 is disposed on an array die, and the peripheral circuitry 201 is disposed on a different die, such as a die that is implemented using complementary metal-oxide-semiconductor (CMOS) technology and is referred to as CMOS die. The array die and the CMOS die are suitably bonded, and electrically coupled together. An example of bonded array die and CMOS die will be described with reference to FIG. 3.

In some examples, a CMOS die can be coupled with multiple array dies. In an example, the semiconductor memory device 200 is an integrated circuit (IC) package that encapsulates one or more array dies and one or more CMOS dies.

The semiconductor memory device 200 is configured to store data in the memory cell array 202, and perform operations in response to received commands (CMD). In some examples, the semiconductor memory device 200 can receive a write command (also referred to as program command in some examples), a read command, an erase command and the like, and operate accordingly. In an example, the semiconductor memory device 200 receives a write command with an address (ADDR) and data (DATA), the semiconductor memory device 200 then stores the data in the memory cell array 202 at the address. In another example, the semiconductor memory device 200 receives a read command with an address, the semiconductor memory device 200 then accesses the memory cell array 202, and outputs data stored at the address of the memory cell array 202. In another example, the semiconductor memory device 200 receives an erase command with an address, the semiconductor memory device 200 then resets one or more blocks of memory cells at the address to an un-programmed state (also referred to erased state), such as "1" in 1-bit, "11" in 2-bit, "111" in 3-bit, and the like in the NAND flash memory technology.

Generally, the memory cell array 202 can include one or more memory planes 260, and each of the memory planes 260 can include a plurality of memory blocks, such as block-1 to block-N as shown in FIG. 2 (N is a positive integer). In some examples, concurrent operations can take place at different memory planes 260. In some examples, each of the memory blocks block-1 to block-N is the smallest unit to carry out an erase operation. Each memory block includes a number of pages. In some examples, a page is the smallest unit that can be programmed. In an example, memory cells of a page can share a word line.

In some examples, the memory cell array 202 is a flash memory array, and is implemented using 3D NAND flash memory technology. Each of the memory blocks block-1 to block-N includes a plurality of memory cell strings that are disposed vertically (e.g., perpendicular to a main surface of a die). Each memory cell string includes a plurality of transistors connected in series. The details of a memory cell string will be described with reference to FIG. 3.

In some examples, the peripheral circuitry 201 includes an interface circuitry 210 and a controller 220 coupled together.

The interface circuitry 210 includes suitable circuitry to interface with the memory cell array 202 or to interface with external components of the semiconductor memory device 200, such as a host device. In some examples, the interface circuitry 210 includes a first portion that interfaces with a host device and is referred to as a host interface, and a second portion that interfaces with the memory cell array 202 and is referred to as an array interface. In the FIG. 2 example, the interface circuitry 210 includes a command decoding circuit 214, an address decoding circuit 215, a page buffer circuit 212, a data input/output (I/O) circuit 211, and a voltage generator 213 coupled together as shown in FIG. 2.

In some examples, the address decoding circuit 215 can receive address (ADDR) from I/O pins coupled to external circuitry (e.g., the host device) and perform decoding of the address. In some examples, the address decoding circuit 215 can operate with the controller 220 to perform decoding of the address. In some examples, the received addresses from the host device are file system logical block addresses. In some examples, the address decoding circuit 215 and the controller 220 can perform functions of a flash translation layer (FTL) to translate from block addresses used by a file system to addresses of physical cells in the memory cell array 202. In an example, the translation from block addresses used by the file system to physical cells in the memory cell array 202 can be used to exclude bad memory cells. In some examples, the addresses of the physical cells are in the form of row address (R-ADDR) and column address (C-ADDR). In response to the row address, the address decoding circuit 215 can generate the word line (WL) signals and select signals, such as top select gate (TSG) signal(s), bottom select gate (BSG) signal(s), and the like, and can provide the memory cell array 202 with the WL signals, and select signals. In some examples, during a write operation, the address decoding circuit 215 provides the WL signals and the select signals to the memory cell array 202 to select a page to program. During a read operation, the address decoding circuit 215 can provide the WL signals and the select signals to select a page for buffering. During an erase operation, the address decoding circuit 215 can provide suitable WL signals and select signals.

The page buffer circuit 212 is coupled to bit lines (BL) of the memory cell array 202 and is configured to buffer data, such as one or more pages of data during read and write operations. In an example, during a write operation, the page buffer circuit 212 can buffer data to be programed and drive the data to bit lines of the memory cell array 202 to write the data into the memory cell array 202. In another example, during a read operation, the page buffer circuit 212 can sense data on the bit lines of the memory cell array 202 and buffer the sensed data for outputting.

In the FIG. 2 example, the data I/O circuit 211 is coupled to the page buffer circuit 212 via data lines (DL). In an example (e.g., during a write operation), the data I/O circuit 211 is configured to receive data from external circuitry (e.g., the host device) of the semiconductor memory device 200, and provide the received data to the memory cell array 202 via the page buffer circuit 212. In another example (e.g., during a read operation), the data I/O circuit 211 is configured to output the data from the memory cell array 202 to external circuitry (e.g., host device) based on the column address (C-ADDR).

The voltage generator 213 is configured to generate voltages of suitable levels for the proper operations of the semiconductor memory device 200. For example, during a read operation, the voltage generator 213 can generate voltages of suitable levels for source voltages, body voltage, various WL voltages, select voltages, and like for the read operation. In some examples, the source voltages are provided as array common source (ACS) voltages to the source terminals of the memory cell array 202 during the read operation; the body voltage is provided to, for example a P-type well (PW) that is the body portion for the memory cell strings, during the read operation. The WL voltages and the select voltages are provided to the address decoding circuit 215, thus the address decoding circuit 215 can output the WL signals and the select signals (e.g. TSG signals and BSG signals) at the suitable voltage levels during the read operation.

In another example, during an erase operation, the voltage generator 213 can generate voltages of suitable levels for source voltages, body voltage, various WL voltages, select voltages, BL voltages and like that are suitable for the erase operation. In some examples, the source voltage is provided as ACS voltages to the source terminals of the memory cell array 202 during the erase operation; the PW voltage is provided to the P-type well that is the body portion for the memory cell strings during the erase operation. The WL voltages and the select voltages are provided to the address decoding circuit 215, thus the address decoding circuit 215 can output the WL signals and the BSG and TSG signals at the suitable voltage levels during the erase operation. The BL voltages are provided to the page buffer circuit 212, thus the page buffer circuit 212 can drive the bit lines (BL) at proper voltage levels during the erase operation. It is noted that the BL voltages may be applied to the bit lines without going through the page buffer circuit 212 in some examples.

In another example, during a write operation, the voltage generator 213 can generate voltages of suitable levels for source voltages, body voltage, various WL voltages, select voltages, BL voltages, verification voltages, reference voltages and like that are suitable for the write operation. In some examples, the source voltage is provided as ACS voltages to the source terminals of the memory cell array 202 during the write operation; the PW voltage is provided to the P-type well that is the body portion for the memory cell strings during the write operation. The WL voltages, the select voltages, and verification voltages are provided to the address decoding circuit 215, thus the address decoding circuit 215 can output the WL signals and the BSG and TSG signals at the suitable voltage levels during the write operation. The BL voltages and the reference voltages are provided to the page buffer circuit 212, thus the page buffer circuit 212 can drive the bit lines (BL) at proper voltage levels during the write operation, and can sense programming status in the verification steps during the write operation.

In some examples, the command decoding circuit 214 is configured to receive commands (CMD) from, for example the host device via I/O pins in command cycles. In some examples, the I/O pins can transmit other information, such as addresses in address cycles, data in data cycles. In some examples, the received commands are commands according to certain high level protocols (e.g., USB protocols).

In some examples, the command decoding circuit 214 and the controller 220 can operate together to decode the received commands. In an example, the command decoding circuit 214 performs initial decoding of the received commands and the commands decoded by the command decoding circuit 214 are provided to the controller 220 for further processing. The controller 220 can perform further decoding, and then generate control parameters for controlling other circuits, such as the page buffer circuit 212, the data I/O circuit 211, the voltage generator 213, and the like based on the commands.

In some examples, the controller 220 can control the voltage generator 213 to generate voltages of suitable levels based on the commands. The controller 220 can coordinate the other circuits, to provide signals to the memory cell array 202 at the suitable time and suitable voltage levels.

In the FIG. 2 example, the controller 220 is implemented with polling modules in a similar manner as the control circuit 130 in FIG. 1 for power saving. In the FIG. 2 example, the controller 220 includes multiple processing cores that can cooperate during operations. In some examples, while the multiple processing cores can operate simultaneously, in some scenarios, some processing cores may need to wait for feedback signals from other processing cores or new commands from the host device before further processing operations. According to some aspects of the present disclosure, in such scenarios when a processing core detects an idle state (e.g., waiting for feedback signals from other processing cores or new commands from the host device), the processing core can provide a disable control to a polling module that is coupled with the processing core, and the polling module can provide a clock enable signal with a disable value to cause a clock gating circuit to output a gated clock signal with a constant voltage. The gated clock signal is provided to the processing core, and the processing core can stop signal switching due to the constant voltage of the gated clock signal.

In some examples, the controller 220 includes multiple microcontroller units (MCUs), such as shown by MCU-1 230, MCU-P 250 (P is a positive integer) and the like. Each MCU includes a polling module (PM), one or more processing cores (PCs), a clock gating circuit (CGC), and some memories, such as read-only memory (ROM), random access memory (RAM) and the like. The polling module is also referred to as a first portion of the MCU and the one or more processing cores can be referred to as a second portion of the MCU. For example, the MCU-1 230 includes a PC-1 232, a PM-1 231, a CGC-1 235, a ROM-1 237, and a RAM-1 238; and the MCU-P 250 includes a PC-P 252, a PM-P 251, a CGC-P 255, a ROM-P 257, and a RAM-P 258. It is noted that the controller 220 can include other MCUs (not shown) that are similarly configured as the MCU-1 230 and the MCU-P 250.

In the following description, MCU-1 230 is described in detail as an example. The description can be suitably applied to other MCUs, such as the MCU-P 250, and the like.

In the FIG. 2 example, the PM-1 231 operates based on a regular clock signal CK, and a PC-1 232 operates based on a gated clock signal CK-G-1. The regular clock signal CK can be provided by a clock source (not shown). In an example, the regular clock signal CK continuously oscillates between a high voltage and a low voltage when the semiconductor memory device 200 is powered up. In an example, the clock source includes a clock generation circuit that generates the regular clock signal CK when the semiconductor memory device 200 is powered up. In another example, the clock source receives a system clock from an external source of the semiconductor memory device 200 via an I/O pin (not shown) of the semiconductor memory device 200, and generates the regular clock signal CK based on the system clock.

In some examples, the CGC-1 235 can generate the gated clock signal CK-G-1 based on the regular clock signal CK and a clock enable signal EN-1. Transitions (e.g., voltage transitions between a high voltage and a low voltage) in the regular clock signal CK are enabled/disabled for outputting in the gated clock signal CK-G-1 based on the clock enable signal EN-1. For example, when the clock enable signal EN-1 has a first value (also referred to as enable value), such as "1" (e.g., high voltage level), the CGC-1 235 outputs transitions (voltage transitions) in the gated clock signal CK-G-1 in response to the transitions in the regular clock signal CK; when the clock enable signal EN-1 has a second value (also referred to as disable value), such as "0" (e.g., ground voltage level), the CGC-1 235 outputs a constant voltage level, such as ground voltage level, as the gated clock signal CK-G-1 regardless of the transitions in the regular clock signal CK.

According to an aspect of the disclosure, the clock enable signal EN-1 is provided by the PM-1 231. The PM-1 231 operates based on the regular clock signal CK, and can include any suitable combinational circuit and sequential circuit (e.g., latches, flip-flops and the like). In some examples, the PM-1 231 receives a disable control DC-1 from the PC-1 232 and a wakeup control WC-1 from an external source of the MCU-1 230. The disable control DC-1 can cause the PM-1 231 to set the clock enable signal EN-1 to the disable value, and the wakeup control WC-1 can cause the PM-1 231 to set the clock enable signal EN-1 to the enable value.

Generally, the PC-1 232 is implemented using sequential circuitry, for example, using pipeline architecture. Transistors in the PC-1 232, such as transistors in flip-flops and the like, can switch in response to transitions in the CK-G-1, such as rising edges of the CK-G-1, falling edges of the CK-G-1. When the CK-G-1 is gated (e.g., transitions are disabled), the CK-G-1 has a constant voltage level, such as ground voltage level, and the transistors in the PC-1 232 may halt switching. Thus, dynamic power consumption can be reduced, and power saving can be achieved.

In some examples, the PC-1 232 is suitably coupled with the ROM-1 237 and the RAM-1 238 and can access the ROM-1 237 and the RAM-1 238 during operation. For example, the ROM-1 237 stores firmware instructions, and the PC-1 232 can access the ROM-1 237 to read the firmware instructions and execute the firmware instructions. Further, the PC-1 232 can access the RAM-1 238 to store data and to read the stored data during operation in some examples.

According to an aspect of the disclosure, the PC-1 232 can execute firmware to generate the disable control DC-1. In some examples, initially the PM-1 231 outputs the clock enable signal EN-1 with the enable value. When the clock enable signal EN-1 has the enable value, the CGC-1 235 outputs transitions in the gated clock signal CK-G-1 in response to the transitions in the regular clock signal CK. The gated clock signal CK-G-1 is provided to the PC-1 232, and transistors in the PC-1 232 can switch in response to the gated clock signal CK-G-1. For example, in response to the gated clock signal CK-G-1, the PC-1 232 can execute firmware instructions that set a value in a register (not shown). For ease of description, the register is referred to as MCU-disable register and is an internal register of the MCU-1 230. In some examples, the MCU-disable register is in the PM-1 231. In an example, the PC-1 232 can execute firmware instructions to set the MCU-disable register to "1". Further, in response to a switch from "0" to "1" in the MCU-disable register, the PM-1 231 can output the EN-1 with the disable value.

When the clock enable signal EN-1 has the disable value, the CGC-1 235 outputs the gated clock signal CK-G-1 with a constant voltage level, such as ground voltage level. Then, transistors, such as transistors in flip-flops, in the PC-1 232 do not switch, and thus dynamic power consumption can be reduced, and power saving can be achieved.

It is noted that the PM-1 231 operates based on the regular clock signal CK, and can continue operations when the PC-1 232 halts operations. When an external source, such as the MCU-P 250, host device, and the like provides a signal in the wakeup control WC-1, for example, a signal switching from "0" to "1" from the wakeup source, the MCU-disable register can be cleared and can have a value "0". In response to the MCU-disable register having the value "0", the PM-1 231 outputs the clock enable signal EN-1 with the enable value. Thus, the CGC-1 235 outputs transitions in the gated clock signal CK-G-1 in response to transitions in the regular clock signal CK. In response to the transitions in the gated clock signal CK-G-1, the PC-1 232 can wake up and continue operations.

It is noted that the wakeup control WC-1 can include signals from multiple wake up sources. In some examples, the multiple wakeup sources can be suitably ordered according to a priority sequence, and the PM-1 231 can generate a wake up status WU-1 to indicate which wake up source triggers the current wakeup. In some examples, the wakeup status WU-1 can be used to locate portions of firmware to restore firmware execution. In some related example, without the wakeup status, the processing core needs time to determine where to continue the operation after each wakeup, and performance may be sacrificed.

According to an aspect of the disclosure, firmware based clock gating is used to control the clock gating operations in the MCUs. Firmware modules can be updated to include the firmware based clock gating, and the firmware modules can be suitably reused. Thus, the firmware based clock gating provides flexibility in implementation.

According to another aspect of the disclosure, turning off the processing cores can save a large portion of dynamic power consumption. Further, the wakeup status can be used to restore the MCU operation and to keep the continuity of the MCU operation, without sacrificing performance. The wakeup status will be further discussed with reference to FIG. 4 and FIG. 5.

Figure 3:
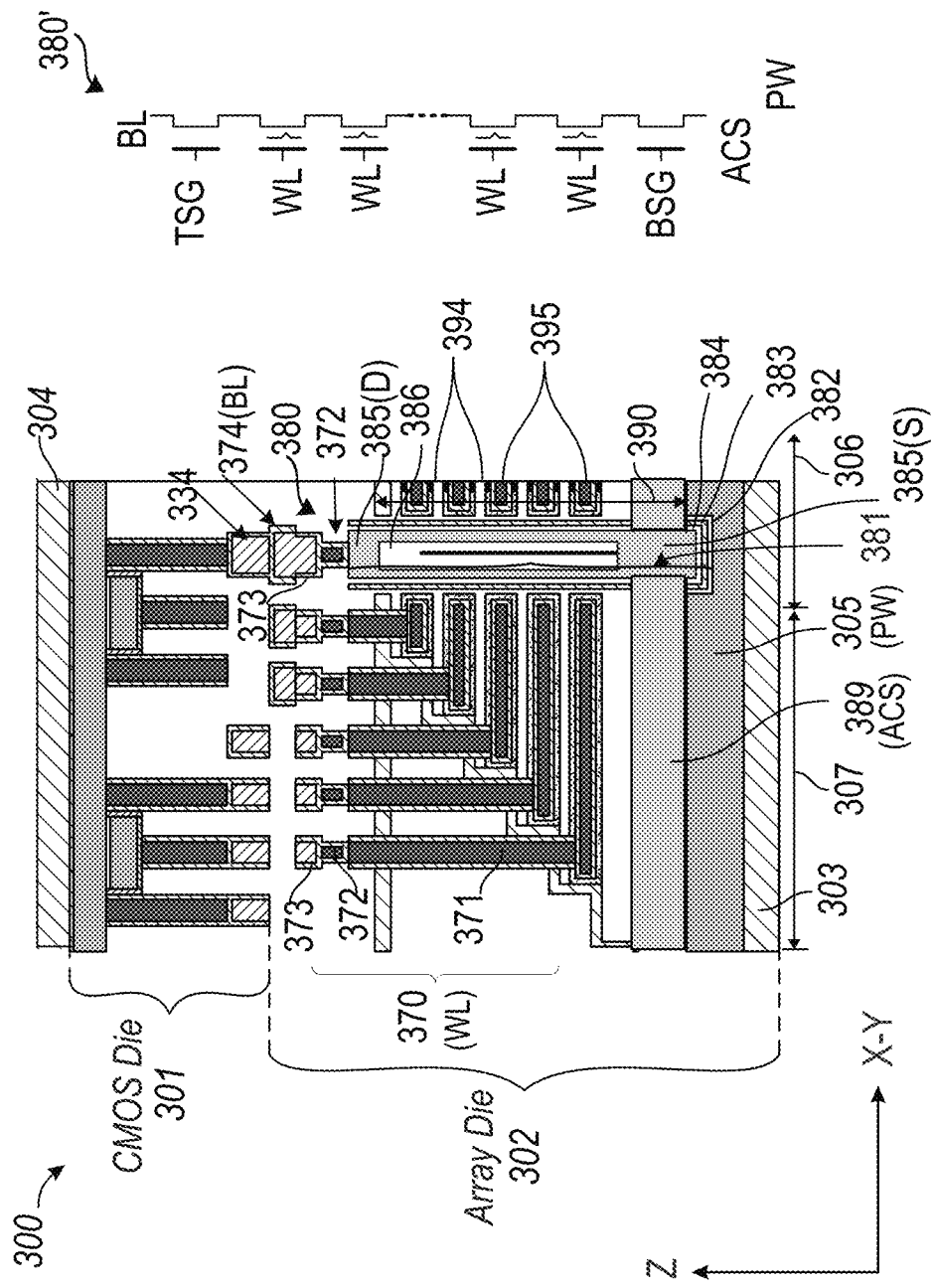
FIG. 3 shows a cross-sectional view of a semiconductor memory device, and a schematic symbol of a memory cell string according to some examples of the disclosure.

FIG. 3 shows a cross-sectional view of a semiconductor memory device 300 according to some examples of the disclosure. The semiconductor memory device 300 can be the semiconductor memory device 200 in some examples. The semiconductor memory device 300 includes an array die 302 and a CMOS die 301 bonded together according to some examples of the disclosure.

It is noted that, in some examples, a semiconductor memory device can include multiple array dies and a CMOS die. The multiple array dies and the CMOS die can be stacked and bonded together. The CMOS die is respectively coupled to the multiple array dies, and can drive the respective array dies to operate in the similar manner as the semiconductor memory device 300.

The array die 302 includes a substrate 303, and memory cells formed on the substrate 303. The CMOS die 301 includes a substrate 304, and peripheral circuitry formed on the substrate 304. For simplicity, the main surface of the substrate 303 is referred to as an X-Y plane, and the direction perpendicular to the main surface is referred to as Z direction.

The substrate 303 and the substrate 304 respectively can be any suitable substrate, such as a silicon (Si) substrate, a germanium (Ge) substrate, a silicon-germanium (SiGe) substrate, and/or a silicon-on-insulator (SOI) substrate. The substrate 303 and the substrate 304 respectively may include a semiconductor material, for example, a Group IV semiconductor, a Group III-V compound semiconductor, or a Group II-VI oxide semiconductor. The Group IV semiconductor may include Si, Ge, or SiGe. The substrate 303 and the substrate 304 respectively may be a bulk wafer or an epitaxial layer.

The semiconductor memory device 300 includes memory cell arrays (e.g., the memory cell array 202) and peripheral circuitry (e.g., the address decoding circuit 215, the page buffer circuit 212, the data I/O circuit 211, the voltage generator 213, the controller 220 and the like). In the FIG. 3 example, the memory cell arrays are formed on the substrate 303 of the array die 302 and the peripheral circuitry is formed on the substrate 304 of the CMOS die 301. The array die 302 and the CMOS die 301 are disposed face to face (the surface with circuitry disposed on is referred to as face, and the opposite surface is referred to as back), and bonded together.

In some examples, wells can be formed in the substrate 303 respectively for blocks as body portions for the blocks. In the FIG. 3 example, a P-type well 305 is formed in the substrate 303, and a block of three dimensional (3D) NAND memory cell strings can be formed in the P-type well 305. The P-type well 305 can form a body portion (e.g., in connection with a PW terminal) for the 3D NAND memory cell strings, and a voltage that is referred to as PW can be applied to the P-type well 305 via the PW terminal. In some examples, the memory cell array is formed in a core region 306 as an array of vertical memory cell strings. Besides the core region 306 and the periphery region, the array die 302 includes a staircase region 307 (also referred to as a connection region in some examples) to facilitate making connections to, for example, gates of the memory cells in the vertical memory cell strings, gates of the select transistors, and the like. The gates of the memory cells in the vertical memory cell strings correspond to word lines for the NAND memory architecture.

In the FIG. 3 example, a vertical memory cell string 380 is shown as representation of an array of vertical memory cell strings formed in the core region 306. FIG. 3 also shows a schematic symbol version of the vertical memory cell string 380' corresponding to the vertical memory cell string 380. The vertical memory cell strings 380 are formed in a stack of layers 390. The stack of layers 390 includes gate layers 395 and insulating layers 394 that are stacked alternatingly. The gate layers 395 and the insulating layers 394 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 395 correspond to gates of the transistors. The gate layers 395 are made of gate stack materials, such as high dielectric constant (high-k) gate insulator layers, metal gate (MG) electrode, and the like. The insulating layers 394 are made of insulating material(s), such as silicon nitride, silicon dioxide, and the like.

According to some aspects of the disclosure, the vertical memory cell strings are formed of channel structures 381 that extend vertically (Z direction) into the stack of layers 390. The channel structures 381 can be disposed separate from each other in the X-Y plane. In some examples, the channel structures 381 are disposed in the form of arrays between gate line cut structures (not shown). The gate line cut structures are used to facilitate replacement of sacrificial layers with the gate layers 395 in a gate-last process. The arrays of the channel structures 381 can have any suitable array shape, such as a matrix array shape along the X direction and the Y direction, a zig-zag array shape along the X or Y direction, a beehive (e.g., hexagonal) array shape, and the like. In some examples, each of the channel structures has a circular shape in the X-Y plane, and a pillar shape in the X-Z plane and Y-Z plane. In some examples, the quantity and arrangement of the channel structures between gate line cut structures is not limited.

In some examples, the channel structure 381 has a pillar shape in the Z direction that is perpendicular to the direction of the main surface of the substrate 303. In an example, the channel structure 381 is formed by materials in the circular shape in the X-Y plane, and extends in the Z direction. For example, the channel structure 381 includes function layers, such as a blocking insulating layer 382 (e.g., silicon oxide), a charge storage layer (e.g., silicon nitride) 383, a tunneling insulating layer 384 (e.g., silicon oxide), a semiconductor layer 385, and an insulating layer 386 that have the circular shape in the X-Y plane, and extend in the Z direction. In an example, the blocking insulating layer 382 (e.g., silicon oxide) is formed on the sidewall of a hole (into the stack of layers 390) for the channel structure 381, and then the charge storage layer (e.g., silicon nitride) 383, the tunneling insulating layer 384, the semiconductor layer 385, and the insulating layer 386 are sequentially stacked from the sidewall. The semiconductor layer 385 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 386 is formed of an insulating material, such as silicon oxide and/or silicon nitride, and/or may be formed as an air gap.

According to some aspects of the disclosure, the channel structure 381 and the stack of layers 390 together form the memory cell string 380. For example, the semiconductor layer 385 corresponds to the channel portions for transistors in the memory cell string 380, and the gate layers 395 correspond to the gates of the transistors in the memory cells string 380. Generally, a transistor has a gate that controls a channel, and has a drain and a source at each side of the channel. For simplicity, in the FIG. 3 example, the upper side of the channel for transistors in FIG. 3 is referred to as the drain, and the bottom side of the channel for transistors in FIG. 3 is referred to as the source. It is noted that the drain and the source can be switched under certain driving configurations. In the FIG. 3 example, the semiconductor layer 385 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the memory cell string 380 are connected in series.

The memory cell string 380 includes memory cell transistors (or referred to as memory cells). A memory cell transistor can have different threshold voltages based on carrier trappings in a portion of the charge storage layer 383 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "11" in two binary bits. When holes are expelled from the floating gate (or electrons are trapped in the floating gate), the threshold voltage of the memory cell transistor is increased, thus the memory cell transistor can be programmed to other suitable states.

The memory cell string 380 includes one or more top select transistors configured to couple/de-couple the memory cells in the memory cell string 380 to a bit line, and includes one or more bottom select transistors configured to couple/de-couple the memory cells in the memory cell string 380 to the ACS.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled from the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled from the ACS.

According to some aspects of the disclosure, the bottom portion of the semiconductor layer 385 in the channel hole corresponds to a source side of the vertical memory cell string 380, and the bottom portion is labeled as 385(S). A common source layer 389 is formed in conductive connection with the source of the vertical memory cell string 380. The common source layer 389 can includes one or more layers. In some examples, the common source layer 389 includes a silicon material, such as intrinsic polysilicon, doped polysilicon (such as N-type doped silicon, P-type doped silicon) and the like. In some examples, the common source layer 389 may include metal silicide to improve conductivity. The common source layer 389 is similarly in conductive connection with sources of other vertical memory cell strings (not shown), and thus forms an array common source (ACS).

In some examples, when the vertical memory cell strings 380 are configured to be erased by blocks, the common source layer 389 can extend and cover the core regions of a block and staircase regions for the block. In some examples, for different blocks that are erased separately, the common source layer 389 may be suitably insulated for the different blocks.

In the FIG. 3 example, in the channel structure 381, the semiconductor layer 385 extends vertically from the source side of the channel structure 381 up, and forms a top portion corresponding to a drain side of the vertical memory cell string 380. The top portion of the semiconductor layer 385 is labeled as 385(D). It is noted that drain side and the source side are named for the ease of description. The drain side and the source side may function differently from the names.

In the FIG. 3 example, a connection structure, such as a via structure 372 with a metal wire 373, a bonding structure 374, and the like, can be formed to electrically couple the top portion of the semiconductor layer 385(D) with a bit line (BL).

Further in the FIG. 3 example, the staircase region 307 includes a staircase that is formed to facilitate word line connections to the gates of transistors (e.g., memory cells, top select transistor(s), bottom select transistor(s)). For example, a word line connection structure 370 includes a contact structure 371, a via structure 372, and a metal wire 373 that are conductively coupled together. The word line connection structure 370 can electrically couple a WL to a gate terminal of a transistor in the memory cell string 380.

In the FIG. 3 example, the array die 302 and the CMOS die 301 are disposed face-to-face (circuitry side is face, and the substrate side is back) and bonded together. Generally, the peripheral circuitry on the CMOS die interfaces the semiconductor memory device 300 with external circuitry.

In the FIG. 3 example, the CMOS die 301 and the array die 302 respectively include bonding structures that can be aligned with each other. For example the CMOS die 301 includes a bonding structure 334 and the array die 302 includes a corresponding bonding structure 374. The array die 302 and the CMOS die 301 can be suitably aligned, thus the bonding structure 334 is aligned with the bonding structure 374. When the array die 302 and the CMOS die 301 are bonded together, the bonding structure 334 is respectively bonded and electrically coupled with the bonding structure 374.

While a 3D NAND flash memory device is described in detail with reference to FIG. 2 and FIG. 3, some aspects of the present disclosure are not limited to a 3D NAND flash memory device.

As described with reference to FIG. 2, the wakeup control, such as WU-1 and the like can include signals from multiple wakeup sources. In some examples, any one of wakeup sources can cause the MCU-disable register to be cleared (e.g., to be "0"), and to restore the transitions in the gated clock signal. In some examples, wakeup signal information, such as priority, and the like can be suitably recorded, and a wakeup status can be generated accordingly. The wakeup status can be used to achieve operation continuity.

In some examples, more than one wakeup source may have wakeup conditions at the same time, the wakeup status can be generated to indicate the wakeup source with the highest priority. In an example, a polling module, such as the polling module PM-1 231, and the like, includes a first-in-first-out (FIFO) queue that can queue information of wakeup sources (have wakeup conditions) according to a priority sequence. For example, the queue can store wakeup statuses respectively associated with wakeup sources according to the priority sequence of the wakeup sources.

FIG. 4 shows a table 400 of wakeup source priorities according to some examples of the disclosure. For each operation type (e.g., read operation type, program operation type, erase operation type), multiple wakeup conditions can be defined. For example, a read operation type can include a first wakeup condition from read wakeup source 0, a second wakeup condition from read wakeup source 1, and a third wakeup condition from read wakeup source 2. The wakeup conditions have a priority sequence of the read wakeup source 0 (highest priority), the read wakeup source 1 and the read wakeup source 3 (lowest priority). When multiple wakeup conditions happen at the same time, for example, the first wakeup condition from the read wakeup source 0 and the third wakeup condition from the read wakeup source 2 happen in a same clock cycle, the wakeup signal information can be suitably stored. For example, a first wakeup status indicative of the read wakeup source 0 and a second wakeup status indicative of the read wakeup source 2 can be stored for example in a queue. Then, first operations (first firmware portion) associated with the first wakeup status can be performed and then second operations (second firmware portion) associated with the second wakeup status can be performed.

According to an aspect of the disclosure, MCU clock gating functions can be selectively disabled for respective operation types (e.g., read operation type, program operation type, erase operation type). In some examples, the semiconductor memory device 200 is tested at a factory before being sold to a client. During the test, the factory may determine to disable MCU clock gating functions for one or more operation types due to, for example, performance issues in a corner case, the factory can store three factory setup parameters (referred to as mcu_cg_dis_read, mcu_cg_dis_pgm, mcu_cg_dis_ers) in, for example, an initialization partition 265 in the memory cell array 202. In an example, the factory setup parameter mcu_cg_dis_read is used to indicate whether to disable clock gating function for read operation type (e.g., "1" for disable); the factory setup parameter mcu_cg_dis_pgm is used to indicate whether to disable clock gating function for program operation type (e.g., "1" for disable); and the factory setup parameter mcu_cg_dis_ers is used to indicate whether to disable clock gating function for erase operation type (e.g., "1" for disable).

The information in the initialization partition 265 can be loaded in the controller 220 (e.g., RAM-1 238, RAM-P 258 and the like) when the semiconductor memory device 200 is powered up. Based on the three factory setup parameters mcu_cg_dis_read, mcu_cg_dis_pgm, mcu_cg_dis_ers, clock gating functions can be disabled for one or more operation types. In an example, the factory setup parameter mcu_cg_dis_read has a value of "1" (disable clock gating function for read operation type), the factory setup parameter mcu_cg_dis_pgm has a value of "0", mcu_cg_dis_ers has a value of "0". Then, clock gating function can be disabled for read operation type, and clock gating functions can be performed during the program operations and the erase operations. For read operations, even though the MCU-disable register has a value "1" (indicative of clock gating), the clock enable signal (e.g., EN-1, EN-P and the like) is kept at value "1" (transitions are not gated). It is noted that, in this example, for program operations and erase operations, the clock enable signal (e.g., EN-1, EN-P and the like) can be value "0" (transitions are gated) when the MCU-disable register has a value "1" (indicative of clock gating).

Figure 5:
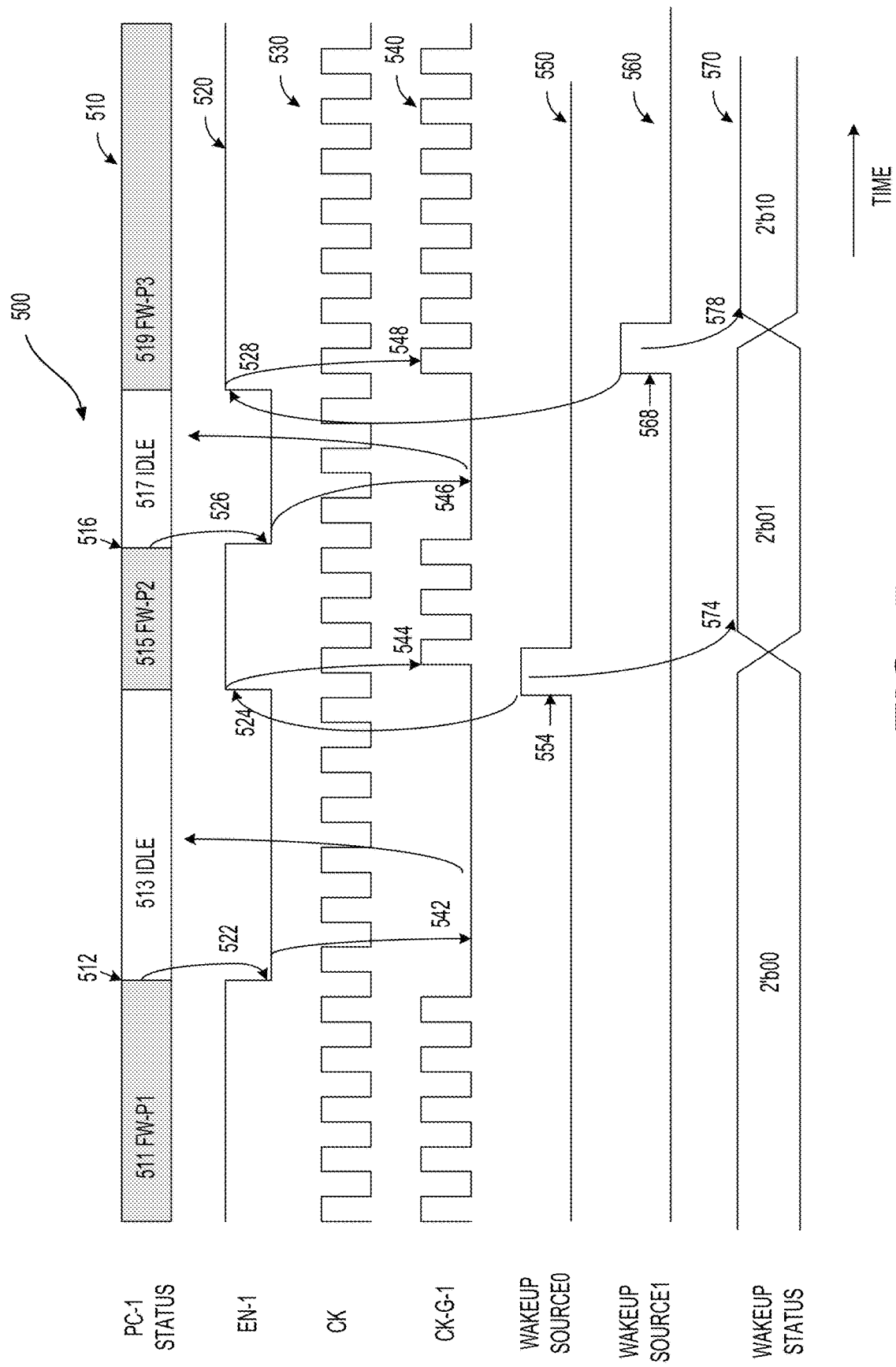
FIG. 5 shows a plot for illustrating signals in a control circuit according to some examples of the disclosure.

FIG. 5 shows a plot 500 for illustrating signals in a control circuit according to an example of the disclosure. For example, the control circuit is the MCU-1 230 in FIG. 2. The plot includes a status chart 510 for the operation status of PC-1 232; a waveform 520 for the clock enable signal EN-1; a waveform 530 for the regular clock signal CK; a waveform 540 for the gated clock signal CK-G-1; a waveform 550 for a signal from a wakeup source 0; a waveform 560 for a signal from a wakeup source 1; and a waveform 570 for the wakeup status.

In an example, initially, as shown by 511 in the status chart 510, the PC-1 232 executes firmware portion 1 (FW-P1) during an operation, such as a read operation, a program operation, an erase operation and the like. At certain point, such as shown by 512, the PC-1 232 waits for signals from other MCUs or a host device, and the firmware portion 1 can cause the PC-1 232 to set the value in the MCU-disable register to "1".

In response to the MCU-disable register having the value "1", the PM-1 231 can generate the clock enable signal EN-1 with the disable value "0" as shown by 522.

In response to the clock enable signal EN-1 with the disable value "0", the CGC-1 235 can output a constant voltage level (e.g., ground) in the gated clock signal CK-G-1, as shown by 542, regardless of the transitions in the regular clock signal CK. When the gated clock signal CK-G-1 has no signal transitions, the PC-1 232 is in the idle state with reduced dynamic power consumption for power saving, as shown by 513.

In the FIG. 5 example, the WC-1 includes a signal from the wakeup source 0 as shown by 550 and a signal from the wakeup source 1 as shown by 560. When the signal from the wakeup source 0 has a pulse as shown by 554, the PM-1 231 can clear the MCU-disable register (e.g., thus MCU disable register has the value "0") and outputs a wakeup status as shown by 574. In response to the MCU-disable register having the value "0", the PM-1 231 can generate the clock enable signal EN-1 with the enable value "1" as shown by 524.

In response to the clock enable signal EN-1 with the enable value "1", the CGC-1 235 can output transitions in the gated clock signal CK-G-1 in response to transitions in the regular clock signal CK as shown by 544. In response to the transitions in the gated clock signal CK-G-1, the PC-1 232 continues operation, for example executes firmware portion 2 (FW-P2) as shown by 515. In an example, the firmware portion 2 (FW-P2) is associated with the wakeup status being "01" in binary.

Further, at a certain point, such as shown by 516 while the PC-1 232 executes firmware portion 2 (FW-P2), the PC-1 waits for signals from other MCUs or a host device, and the firmware portion 2 can cause the PC-1 232 to set the value in the MCU-disable register to "1".

In response to the MCU-disable register having the value "1", the PM-1 231 can generate the clock enable signal EN-1 with the disable value "0" as shown by 526.

In response to the clock enable signal EN-1 having the disable value "0", the CGC-1 235 can output a constant voltage level (e.g., ground voltage level) in the gated clock signal CK-G-1 regardless of the transitions in the regular clock signal CK as shown by 546. When the gated clock signal CK-G-1 has no signal transitions, the PC-1 232 is in the idle state with reduced dynamic power consumption for power saving, as shown by 517.

In the FIG. 5 example, when the signal from wakeup source 1 has a pulse as shown by 568, the PM-1 231 can clear the MCU-disable register (e.g., then MCU disable register has the value "0") and outputs a wakeup status as shown by 578. In response to the MCU-disable register having the value "0", the PM-1 231 can generate the clock enable signal EN-1 with the enable value "1" as shown by 528.

In response to the clock enable signal EN-1 with the enable value "1", the CGC-1 235 can output transitions in the gated clock signal CK-G-1 in response to transitions in the regular clock signal CK as shown by 548. In response to the transitions in the gated clock signal CK-G-1, the PC-1 232 continues operation, for example executes firmware portion 3 (FW-P3) as shown by 519. In an example, the firmware portion 3 (FW-P3) is associated with the wakeup status being "10" in binary.

In some related examples, when a processing core wakes up, the processing core spends some processing time to determine a portion of firmware to continue operation. Comparing to the related examples, the PC-1 232 can directly execute a portion of firmware associated with the wakeup status without consuming additional processing time to keep the continuity of the operation.

Further, according to an aspect of the disclosure, using firmware based clock gating control, existing firmware can be flexibly upgraded and firmware modules can be reused.

Figure 6:
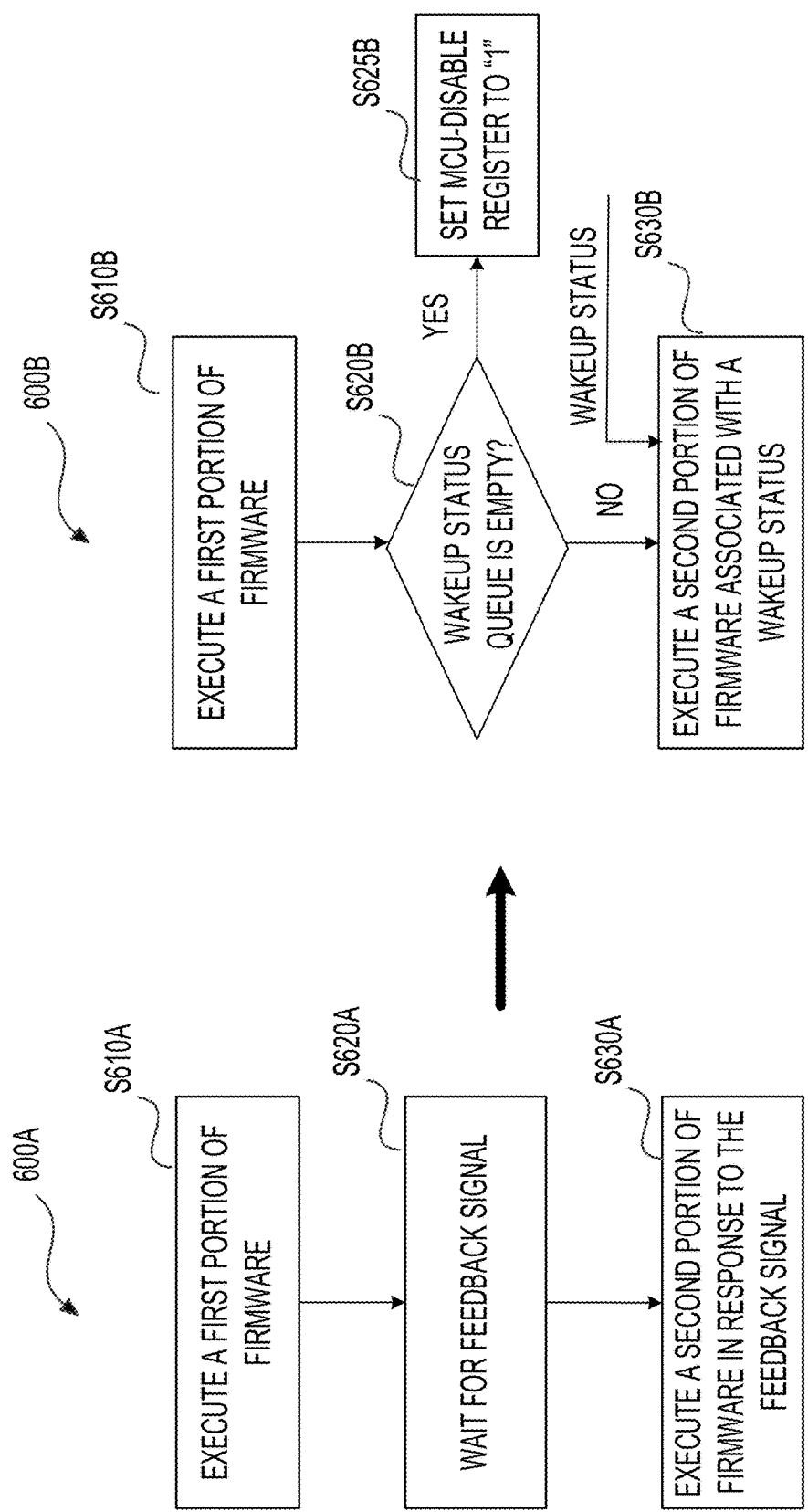
FIG. 6 shows a change from a first firmware control flow to a second firmware control flow according to some examples of the disclosure.

FIG. 6 shows a change from a first firmware control flow 600A to a second firmware control flow 600B according to some examples of the disclosure.

The first firmware control flow 600A can be an existing firmware flow used for a firmware with multiple portions.

At S610A, a first portion of the firmware is executed for example by a processing core.

At S620A, the processing core waits for a feedback signal.

At S630A, a second portion of the firmware is executed in response to the feedback signal.

The first firmware control flow 600A can be changed to add clock disable judgement for firmware based clock gating control, such as shown by the second firmware control flow 600B. The second firmware control flow 600B can be used in the semiconductor memory device 200.

At S610B, a first portion of the firmware is executed for example, by the processing core PC-1 232.

At S620B, a wakeup status queue can be checked to determine whether to disable transitions in a clock. When the wakeup status queue is empty, the second firmware control flow proceeds to S625B; when the wakeup status queue is not empty, the second firmware control flow proceeds to S630B.

At S625B, the MCU-disable register is set to value "1". When the MCU-disable register has value "1", the polling module PM-1 231 outputs the clock enable signal EN-1 with the disable value (e.g., "0"). Then, the clock gating circuit CGC-1 235 outputs a constant voltage (e.g., ground voltage level) in the gated clock signal CK-G-1 regardless of transitions in the regular clock signal CK.

When a wakeup source provides a signal for example having a pulse, the polling module PM-1 231 clears the MCU-disable register (e.g., to have value "0"), and outputs the clock enable signal EN-1 with the enable value (e.g., "1"). The polling module PM-1 231 also queues a wakeup status indicative of the wakeup source in the wakeup status queue.

At S630B, a wakeup status is obtained from the wakeup status queue, and a second portion of the firmware associated with the wakeup status is executed.

Figure 7:
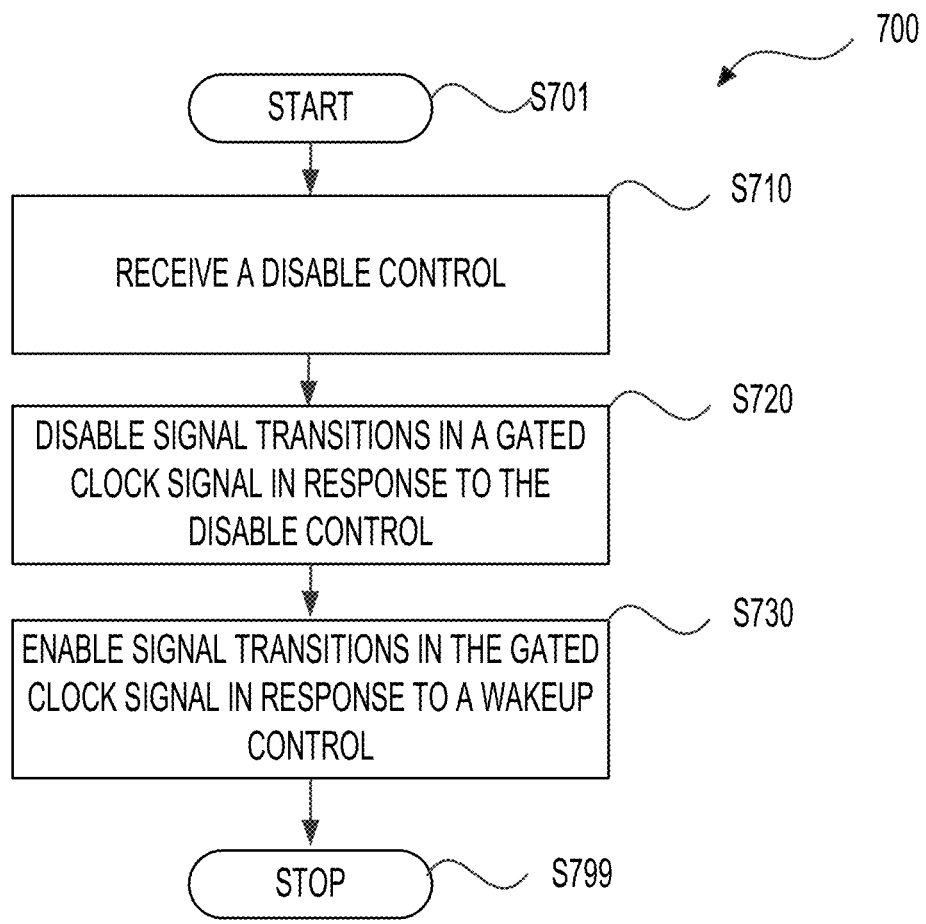
FIG. 7 shows a flow chart outlining a process according to some examples of the disclosure.

FIG. 7 shows a flow chart outlining a process 700 according to some examples of the disclosure. In some examples, the process 700 is executed in a semiconductor device, such as by the first portion 131 of the control circuit 130 in the semiconductor device 100, by the PM-1 231 of the MCU-1 230 in the semiconductor memory device 200, and the like for power saving. The process 700 starts at S701 and proceeds to S710.

At S710, a disable control is received. Using the PM-1 231 in the FIG. 2 as an example, the PM-1 231 receives the disable control DC-1 from the PC-1 232. In some examples, the PC-1 232 executes first instructions that generate the disable control. For example, the PC-1 232 executes first instructions and expects an idle state, for example to wait for feedback signals other MCUs, or input from host device. In response to the expected idle state, the PC-1 232 provides the disable control to the PM-1 231.

At S720, in response to the disable control, signal transitions in a gated clock signal are disabled. For example, in response to the DC-1, the PM-1 231 disables signal transitions in the CK-G-1. The CK-G-1 is used by the PC-1 232. In some examples, the PM-1 231 includes a storage element, such as a register (MCU-disable register) and the like. The storage element can be set to a first state in response to the disable control. Then, a clock enable signal (e.g., EN-1) of a clock gating circuit (e.g., CGC-1 235) can be set according to the stored state in the storage element.

It is noted that, in some examples, when the semiconductor device or semiconductor memory device includes factory setup parameters (e.g., mcu_cg_dis_read, mcu_cg_dis_pgm, mcu_cg_dis_ers and the like) to disable clock gating functions, the polling module can set the clock enable signal to the enable value based on the factory setup parameters regardless of the disable control.

At S730, in response to a wakeup control, the PM-1 231 enables the signal transitions in the CK-G-1. In an example, the storage element is cleared to have a second state in response to the wakeup control. Then, a clock enable signal (e.g., EN-1) of a clock gating circuit (e.g., CGC-1 235) is set according to the stored state in the storage element. In some examples, the wakeup control includes signals from a plurality of wakeup sources. Then, the polling module PM-1 231 can output a wakeup status that is indicative of a wakeup source from the plurality of wakeup sources based on a priority sequence. In some examples, in responses to the signal transitions in the gated clock signal CK-G-1, the PC-1 232 can execute second instructions associated with the wakeup status.

Then, the process proceeds to S799 and terminates.

It is noted that the semiconductor memory device 200 can be suitably used in a memory system.

Figure 8:
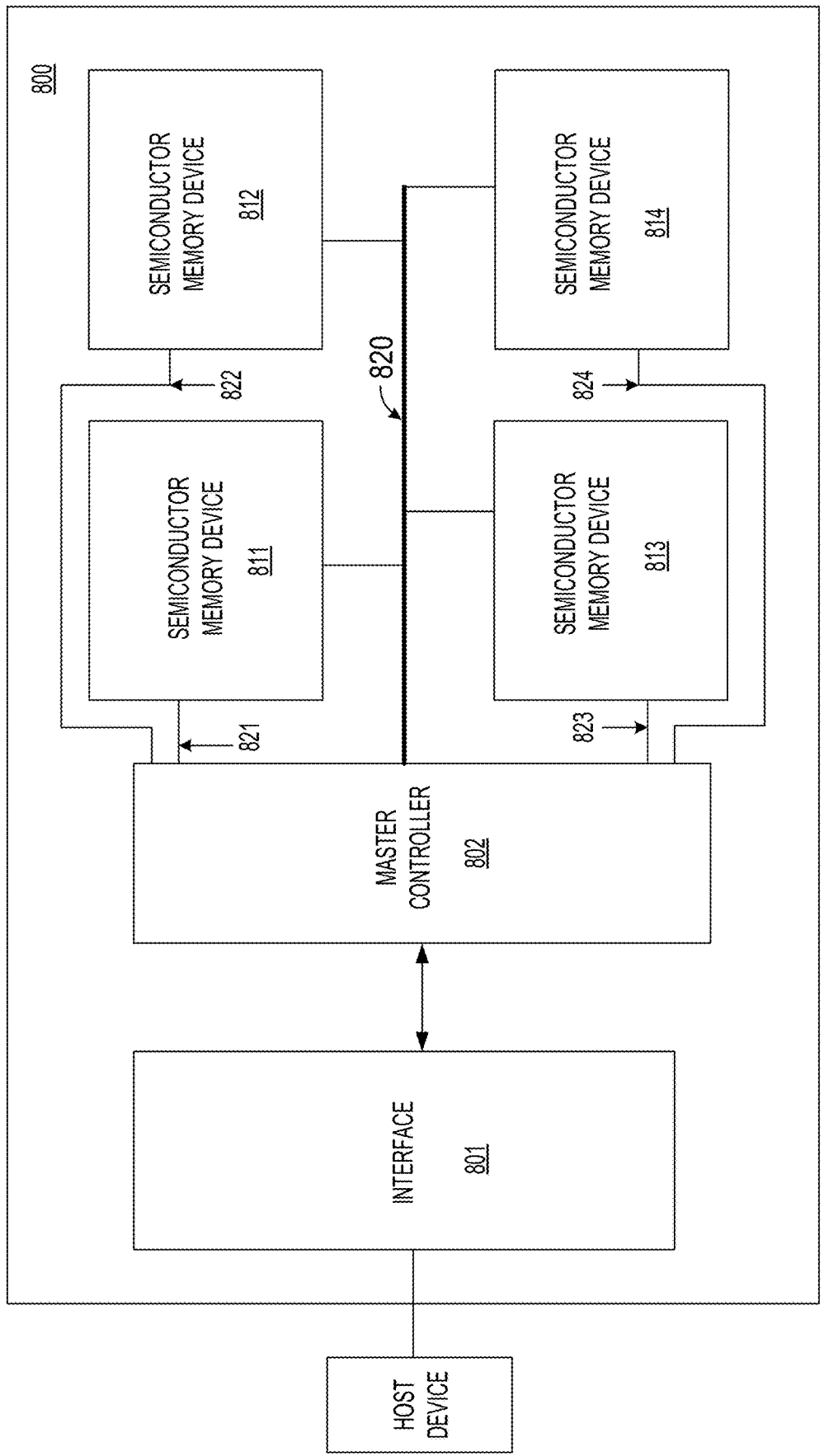
FIG. 8 shows a block diagram of a memory system device according to some examples of the disclosure.

FIG. 8 shows a block diagram of a memory system device 800 according to some examples of the disclosure. The memory system device 800 includes one or more semiconductor memory devices, such as shown by semiconductor memory devices 811-814, that are respectively configured similarly as the semiconductor memory device 200. In some examples, the memory system device 800 is a solid state drive (SSD).

The memory system device 800 includes other suitable components. For example, the memory system device 800 includes an interface 801 and a master controller 802 coupled together as shown in FIG. 8. The memory system device 800 can include a bus 820 that couples the master controller 802 with the semiconductor memory devices 811-814. In addition, the master controller 802 is connected with the semiconductor memory devices 811-814 respectively, such as shown by respective control lines 821-824.

The interface 801 is suitably configured mechanically and electrically to connect between the memory system device 800 and a host device, and can be used to transfer data between the memory system device 800 and the host device.

The master controller 802 is configured to connect the respective semiconductor memory devices 811-814 to the interface 801 for data transfer. For example, the master controller 802 is configured to provide enable/disable signals respectively to the semiconductor memory devices 811-814 to active one or more semiconductor memory devices 811-814 for data transfer.

The master controller 802 is responsible for the completion of various instructions within the memory system device 800. For example, the master controller 802 can perform bad block management, error checking and correction, garbage collection, and the like.

In some embodiments, the master controller 802 is implemented using a processor chip. In some examples, the master controller 802 is implemented using the techniques of polling modules for power saving shown in FIG. 1. In some examples, the master controller 802 is implemented using multiple MCUs, and can be implemented using the techniques of poling module for power saving used in the controller 220.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell array comprising memory cells; and
peripheral circuitry coupled with the memory cell array and comprising:
a clock gating circuit comprising a first input terminal, a second input terminal, and a first output terminal, the first input terminal coupled to a clock source, the first output terminal configured to output a gated clock signal based on a clock signal from the clock source and a clock enable signal;
a polling module comprising a third input terminal, a fourth input terminal, and a second output terminal, the third input terminal configured to receive a wakeup control, the fourth input terminal configured to receive a disable control, the second output terminal coupled to the second input terminal of the clock gating circuit and configured to output the clock enable signal based on the wakeup control or the disable control; and
a processing core comprising a fifth input terminal and a third output terminal, the fifth input terminal coupled to the first output terminal of the clock gating circuit, the third output terminal coupled to the third input terminal of the polling module and configured to output the disable control during an operation.

2. The memory device of claim 1, wherein the second output terminal of the polling module is configured to output the clock enable signal set to a disable value in response to the disable control and output the clock enable signal set to an enable value in response to the wakeup control.

3. The memory device of claim 2, wherein:
the first output terminal of the clock gating circuit is configured to output the gated clock signal having transitions based on the transitions in the clock signal in response to the clock enable signal having the enable value; and
the first output terminal of the clock gating circuit is configured to output the gated clock signal having a constant voltage in response to the clock enable signal having the disable value.

4. The memory device of claim 1, wherein the processing core is configured to execute first instructions during the operation, the first instructions indicating the third output terminal of the processing core to output the disable control.

5. The memory device of claim 1, wherein the peripheral circuitry further comprises a storage element configured to:
be in a first state in response to the disable control; and
be in a second state in response to the wakeup control.

6. The memory device of claim 1, wherein the wakeup control includes signals from wakeup sources, and the second output terminal of the polling module is configured to output a wakeup status in response to the signals from the wakeup sources.

7. The memory device of claim 6, wherein the second output terminal of the polling module is configured to output the wakeup status in response to the signals from the wakeup sources based on a priority sequence.

8. The memory device of claim 7, wherein:
the operation is one of types of operation,
wakeup conditions are defined for each of the types of operation,
each of wakeup conditions corresponds to one wakeup source of the wakeup sources, and
the wakeup conditions have different priority.

9. The memory device of claim 8, wherein a clock gating function is selectively disabled for respective type of operation.

10. The memory device of claim 1, wherein the processing core comprises at least two processing cores, and each processing core of the at least two processing cores is configured with a corresponding clock gating circuit and a corresponding polling module.

11. The memory device of claim 1, wherein the second output terminal of the polling module is configured to output the clock enable signal set to an enable value based on a factory setup parameter regardless of the disable control.

12. The memory device of claim 1, wherein the memory device comprises a NAND flash memory device.

13. A method, comprising:
outputting, by a polling module to a clock gating circuit, a clock enable signal based on a wakeup control received from a processing core or a disable control; and
outputting, by the clock gating circuit to the processing core, a gated clock signal based on a clock signal and the clock enable signal, wherein the clock enable signal is configured to indicate whether signal transitions in the gated clock signal are enabled.

14. The method of claim 13, wherein the outputting of the clock enable signal comprises:
outputting the clock enable signal set to a disable value in response to the disable control; and
outputting the clock enable signal set to an enable value in response to the wakeup control.

15. The method of claim 14, wherein the outputting of the gated clock signal comprises:
outputting the gated clock signal with transitions based on the transitions in the clock signal in response to the clock enable signal having the enable value; and
outputting the gated clock signal with constant voltage in response to the clock enable signal having the disable value.

16. The method of claim 13, further comprising:
generating, by the processing core executing first instructions, the disable control.

17. The method of claim 13, further comprising:
setting, a storage element to a first state in response to the disable control;
setting, the storage element to a second state in response to the wakeup control; and
outputting, by the clock gating circuit, the gated clock signal based on the storage element.

18. The method of claim 13, wherein the wakeup control includes signals from wakeup sources, and the method further comprises:
outputting a wakeup status in response to the signals from the wakeup sources based on a priority sequence.

19. The method of claim 18, further comprising:
executing, by the processing core, second instructions associated with the wakeup status.

20. A memory system, comprising:
a memory device, comprising:
- a memory cell array comprising memory cells; and
- peripheral circuitry coupled with the memory cell array and comprising:
  - a clock gating circuit comprising a first input terminal, a second input terminal, and a first output terminal, the first input terminal coupled to a clock source, the first output terminal configured to output a gated clock signal based on a clock signal from the clock source and a clock enable signal;
  - a polling module comprising a third input terminal, a fourth input terminal, and a second output terminal, the third input terminal configured to receive a wakeup control, the fourth input terminal configured to receive a disable control, the second output terminal coupled to the second input terminal of the clock gating circuit and configured to output the clock enable signal based on the wakeup control or the disable control; and
  - a processing core comprising a fifth input terminal and a third output terminal, the fifth input terminal coupled to the first output terminal of the clock gating circuit, the third output terminal coupled to the third input terminal of the polling module and configured to output the disable control during an operation; and a master controller coupled with the memory device.

* * * * *